（12） United States Patent
Zheng

(10) Patent No.: US 7,997,768 B2
(45) Date of Patent: Aug. 16, 2011

(54) LED LAMP

(75) Inventor: Shi-Song Zheng, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 311 days.

(21) Appl. No.: 12/391,181

(22) Filed: Feb. 23, 2009

(65) Prior Publication Data

US 2010/0103671 A1 Apr. 29, 2010

(51) Int. Cl.
*F21V 29/00* (2006.01)
(52) U.S. Cl. ........................... 362/294; 362/373
(58) Field of Classification Search .................. 362/294, 362/373, 345, 547, 404, 800, 580, 126, 218, 362/264, 249.02
See application file for complete search history.

(56) References Cited

U.S. PATENT DOCUMENTS

| | | | | |
|---|---|---|---|---|
| 5,455,754 A | * | 10/1995 | Hoffner | 362/249.07 |
| 7,494,249 B2 | * | 2/2009 | Li | 362/294 |
| 7,841,752 B2 | * | 11/2010 | Lee | 362/373 |
| 2007/0285927 A1 | * | 12/2007 | Chen | 362/294 |

* cited by examiner

*Primary Examiner* — Bao Q Truong
(74) *Attorney, Agent, or Firm* — Frank R. Niranjan

(57) ABSTRACT

An LED (light emitting diode) lamp includes an upper base plate, a lower base plate spaced from the upper base plate and a plurality of light emitting modules located between the two base plates. The lower base plate defines a plurality of through holes therein. Each light emitting module comprises a heat sink sandwiched between the two base plates, an LED module embedded in a bottom surface of the heat sink and a lens engaging with the bottom surface of the conductive cylinder to enclose the LED module therein. A lower portion of each lens extends downwardly through a corresponding through hole.

16 Claims, 5 Drawing Sheets

LED LAMP

BACKGROUND OF THE INVENTION

1. Field of the Invention

The disclosure relates to LED (light emitting diode) lamps and, more particularly, to an improved LED lamp capable of having a better management regarding heat dissipation of LEDs of the LED lamp.

2. Description of Related Art

An LED lamp utilizes LEDs as a source of illumination, in which current flowing in one direction through a junction region comprising two different semiconductors results in electrons and holes coupling at the junction region and generating a light beam. The LED is resistant to shock and has an almost endless lifetime under specific conditions, making it a popular, cost-effective and high quality replacement for incandescent and fluorescent lamps.

Known implementations of LED modules in an LED lamp make use of a plurality of individual LEDs to generate light that is ample and of satisfactory spatial distribution. The large number of LEDs, however, increases price and power consumption of the module. Considerable heat is also generated, which, if not adequately addressed at additional expense, impacts LED lamp reliability.

Furthermore, the LEDs are generally arranged on a printed circuit board which is attached to a flat outer surface of an individual heat sink. Conventionally, the heat sink comprises a spreader to whose one side the LED modules are attached and a plurality of fins arranged on another side of the spreader for dissipating heat generated by the LEDs into ambient. However, the LEDs attached to different places of the spreader of the heat sink are hard to be cooled at the same time or at the same degree, because of different places of the spreader having different quantity of the fins responsible for dissipating therefrom. Therefore, some LEDs may be cooled sufficiently and kept in a normal performance, but some LEDs would not be taken care equally, may be overheated and damaged.

What is needed, therefore, is an LED lamp which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
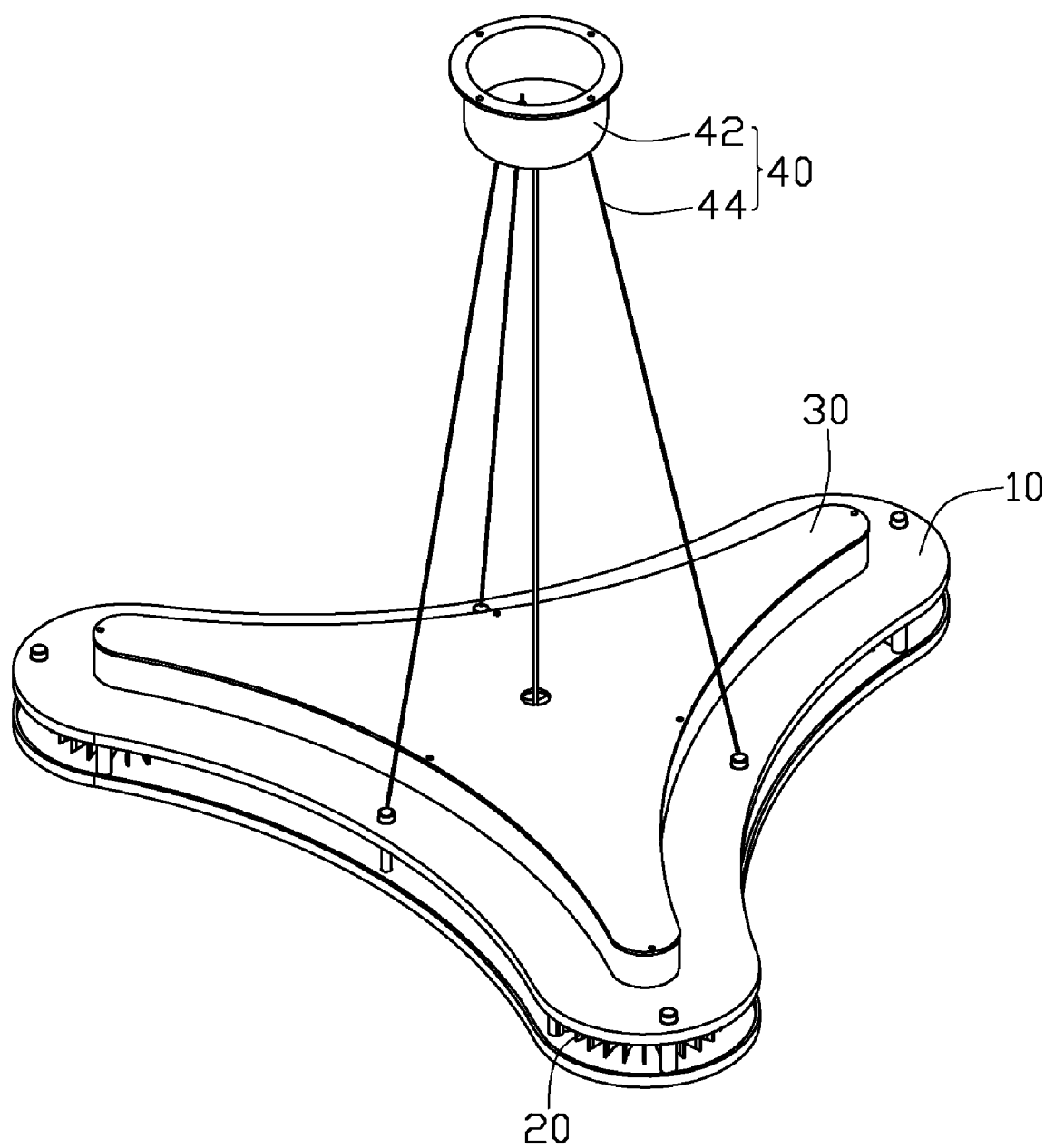
FIG. 1 is an isometric, assembled view of an LED lamp in accordance with an embodiment of the disclosure.
Figure 2:
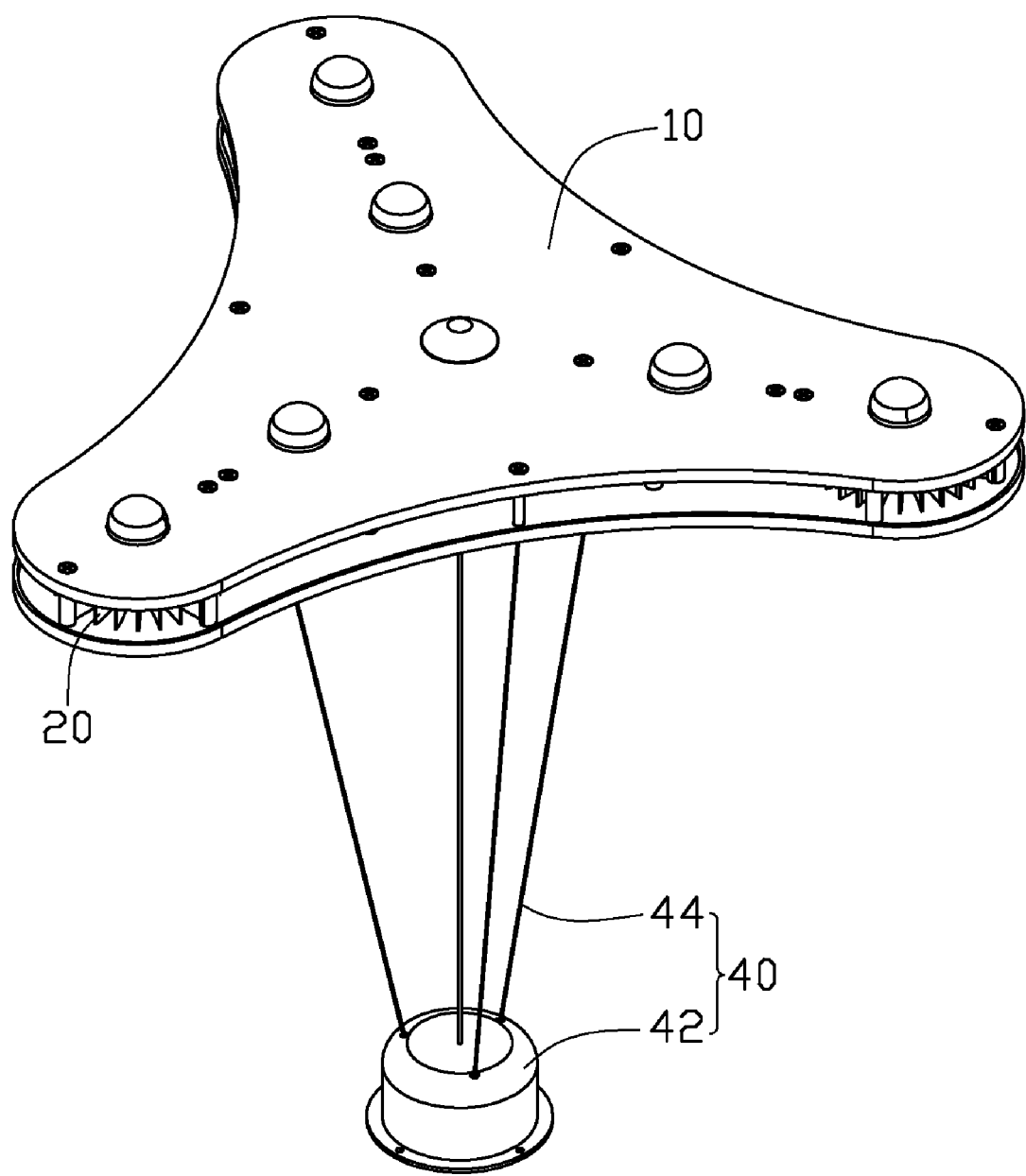
FIG. 2 is an inverted view of the LED lamp of FIG. 1.
Figure 3:
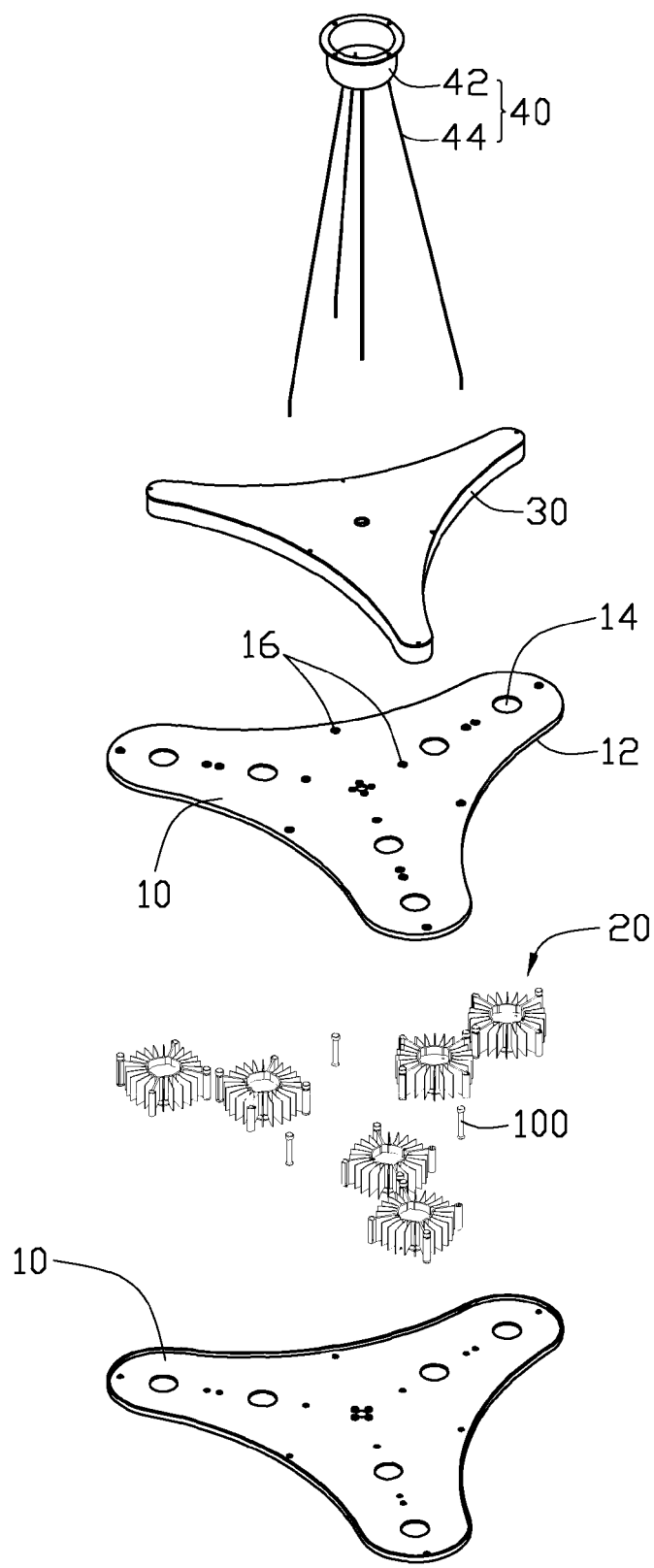
FIG. 3 is an exploded view of the LED lamp of FIG. 1.
Figure 4:
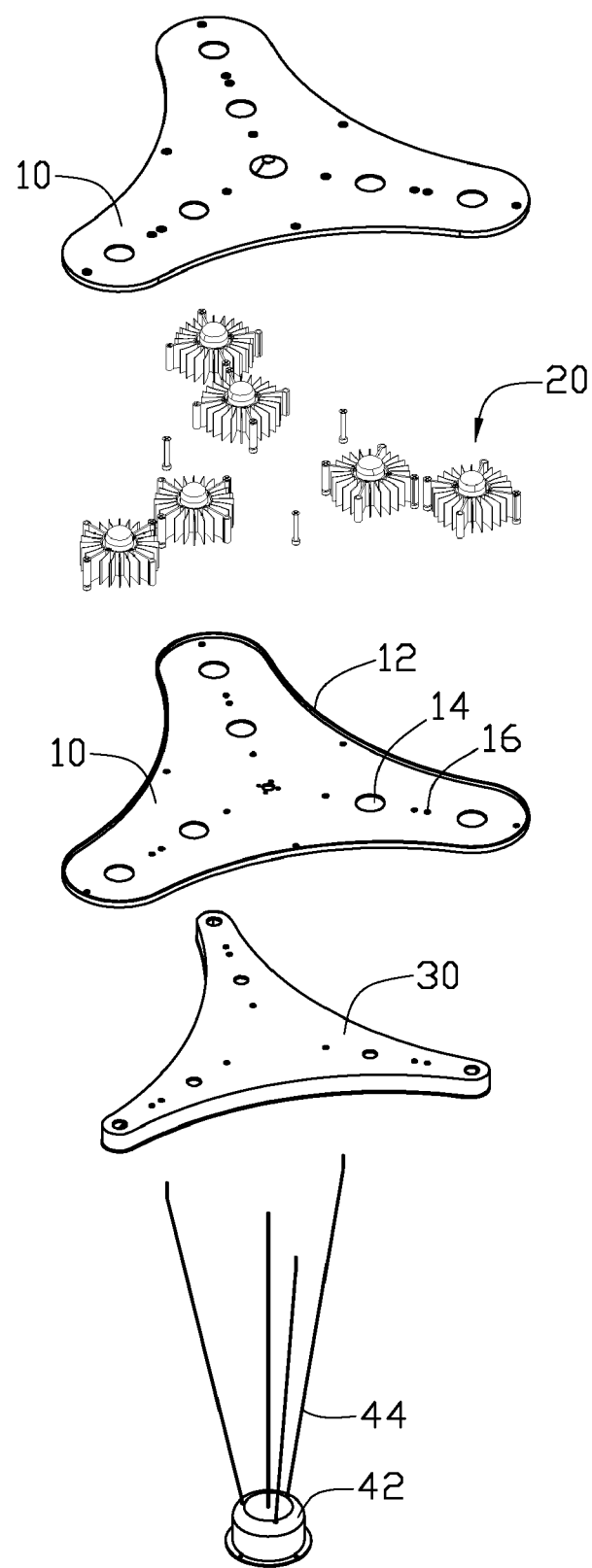
FIG. 4 is an inverted view of the LED lamp of FIG. 3.

Referring to FIGS. 1-3, an LED (light emitting diode) lamp in accordance with an embodiment is illustrated. The LED lamp, which is configured for being suspended indoors to provide illumination, includes an upper base plate 10, a lower base plate 10 spaced from the upper base plate 10, a plurality of light emitting modules 20 sandwiched between the upper and lower base plates 10, a case 30 coupled to a top of the upper base plate 10 and a fixing member 40 connected to the upper base plate 10 to suspend the LED lamp at a desired position.

The upper and lower base plates 10 have the same shape and are configured with substantially triangle-shape having three round corners and three bevel edges curved inwards. Each inwardly curved bevel edge is located between two neighboring corners. The two base plates 10 have flanges 12 respectively extending from edges thereof toward each other for strengthening the upper and lower base plates 10 and smoothen the edges thereof. The lower base plate 10 defines a plurality of through holes 14 therein for downward extensions of the light emitting modules 20 therethrough. A plurality of engaging holes 16 are correspondingly defined in the two base plates 10 for engagingly receiving two opposite ends of bolts 100 to couple the two base plates 10 and the light emitting modules 20 together. The through holes 14 and the engaging holes 16 are evenly arranged in the base plates 10 according to an arrangement of the light emitting modules 20. In this embodiment, every two spaced through holes 14 are respectively arranged in a corresponding one of three imaginary lines connecting a centre and corresponding three corners of the two base plates 10. Every two engaging holes 16 are arranged in the corresponding three imaginary lines and located at two opposite sides of each through hole 14. Three additional engaging holes 16 are located adjacent to middles of the three bevel edges of each of the base plates 10, respectively. The three additional engaging holes 16 are provided for securing the two base plates 10 together. The every two engaging holes 16 are provided for securing the light-emitting modules 20 to the two base plates 10.

Figure 5:
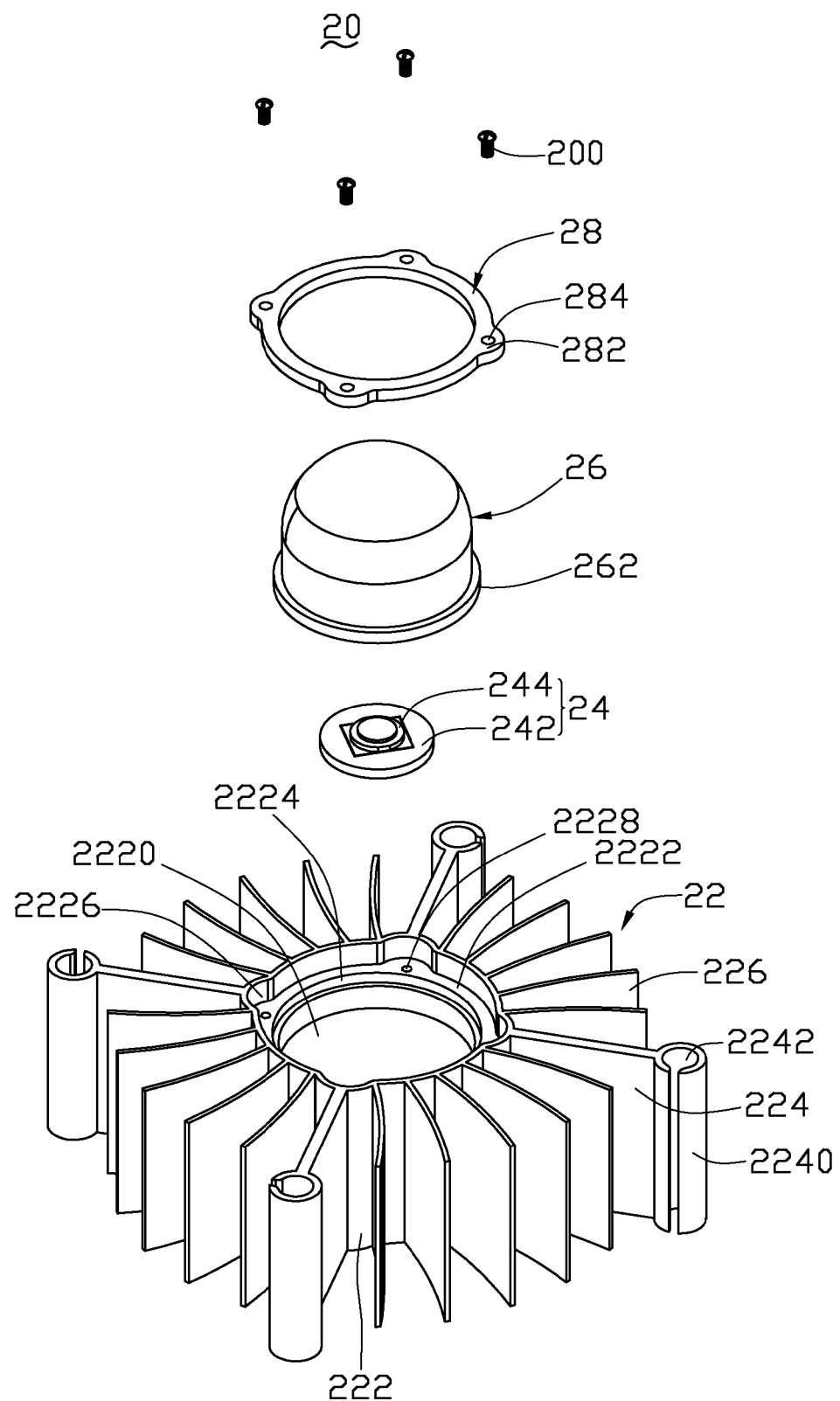
FIG. 5 is an enlarged, exploded view of a light emitting module of the LED lamp of FIG. 3.

Also referring to FIG. 5, each light emitting module 20 comprises a heat sink 22, an LED module 24 embedded in a central portion of a bottom end of the heat sink 22, a lens 26 covering the LED module 24 and a retaining ring 28 fixing the lens 26 to the bottom of the heat sink 22. The heat sink 22 is integrally made of heat conductive material with high heat conductivity such as copper or aluminum, and comprises a conductive cylinder 222, four conductive plates 224 extending symmetrically from a circumference of the conductive cylinder 222 and a plurality of fins 226 extending radially from the circumference of the conductive cylinder 222. A receiving recess 2220 is defined in an upper portion of the conductive cylinder 222 of the heat sink 22 for receiving a corresponding LED module 24 therein. An annular step 2222 is formed by and located in the conductive cylinder 222. The annular step 2222 faces downwardly and located below the receiving recess 2220. An annular wall 2224 is formed by and located in the conductive cylinder 22, extending upwardly and perpendicularly from an inner edge of the annular step 2222. The annular wall 2224 is provided for engaging with an upper end of an outer wall of the lens 26. Four conjunctures between the four conductive plates 224 and the circumference of the conductive cylinder 222 protrude outwardly to define four arched expanding parts 2226 under the annular step 2222. Four retaining holes 2228 are defined in the annular step 2222 and respectively located near the four expanding parts 2226 of the conductive cylinder 222 for engaging with screws 200 extending through the retaining ring 28.

Each LED module 24 comprises a circular printed circuit board 242 and an LED 244 mounted on the printed circuit board 242. The lens 26 is made of transparent/translucent plastic or glass and substantially bullet-shaped. The lens 26 has a circular opening in an upper end thereof for receiving the LED module 24 therein, an arced lower portion extending downwardly from the upper end thereof and an annular engaging flange 262 extending outwardly and horizontally from the upper end thereof. The retaining ring 28 has a dimension larger than that of the engaging flange 262 of the lens 26 and is configured to snugly circle a part of the lower portion of the lens 26 immediately below the engaging flange 262. The retaining ring 28 has four protruding tabs 282 protruding symmetrically and outwardly from a circumference thereof. Each retaining tab 282 defines an extending hole 284 therein for extension of the screw 200.

Opposite two of the conductive plates 224 are symmetrical to each other relative to an axis of the conductive cylinder 222. The fins 226 are curved along a clockwise direction. Each conductive plate 224 has a vertical retaining sleeve 2240 at a distal end thereof. Each retaining sleeve 2240 is parallel to the axis of the conductive cylinder 222 and defines a receiving hole 2242 therein. The receiving holes 242 of opposite two retaining sleeves 2240 of the heat sink 22 each receive a corresponding bolt 100 therein. The fins 226, the conductive plates 224 and the conductive cylinder 222 all have equal heights and are coplanar with each other at their bottom and top ends.

In assembly of each light emitting module 20, the LED module 24 is received in the receiving recess 2220 and attached to a bottom face of the heat sink 22 above the receiving recess 2220. The engaging flange 262 of the lens 26 is received in the conductive cylinder 222 and fitly engages the annular wall 2224 defined in the conductive cylinder 222, whereby the lens 26 encloses the LED module 24 therein. The annular step 2222 is coplanar with a bottom surface of the engaging flange 262. The retaining ring 28 is put onto the arced lower portion of the lens 26 and abuts simultaneously against the annular step 2222 and the bottom surface of the engaging flange 262. The protruding tabs 282 of the retaining ring 28 are received in the corresponding expanding parts 2226 of the conductive cylinder 222. The screws 200 are respectively extended through the extending holes 284 of the retaining ring 28 and screwed into the retaining holes 2228 of the annular step 2222 to thus lock the retaining ring 28 to the annular step 2222 and securely hold the lens 26 in position. The arced lower portion of the lens 26 is projected downwardly from the bottom end of the conductive cylinder 222.

The case 30 is placed on the top of the upper base plate 10 and occupies most area of the top of the upper base plate 10 for receiving some related electronic components such as selenium rectifier, driving and controlling modules therein. The fixing member 40 comprises a fixing part 42 for fixing to ceiling indoor and a plurality of suspending wire 44 connected to the fixing part 42 and the upper base plate 10 to suspend the LED lamp.

In assembly of the LED lamp, the light emitting modules 20 are sandwiched between the two base plates 10 with a bottom of heat sink 20 rested on a top surface of the lower base plate 10 and a top of the heat sink 20 abutting against a bottom surface of the upper base plate 10. Simultaneously, the arced lower portions of the lenses 26 of the light emitting units 20 are respectively extended downwardly through the corresponding through holes 14 of the lower base plate 10 to expose at underside of the lower base plate 14, so as light emitted by the LED modules 24 travel through the lenses 26 to illuminate an area below the LED lamp. The bolts 100 received in the retaining sleeves 2240 of the heat sinks 22 of the light emitting modules 20 are engagingly received in the corresponding engaging holes 16 of the two base plates 10 to thus securely couple the two base plates 10 and the light emitting modules 20 together.

In use of the LED lamp, since every light emitting modules 20 are independent and spaced from each other, heat generated by each LED module 24 is removed from the LED module 24 by an individual heat sink 22; thus every LED module 24 is taken care equally and independently regarding its heat dissipation and would not be overheated and damaged accidently.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. An LED (light emitting diode) lamp, comprising:
an upper base plate;
a lower base plate spaced from the upper base plate and defining a plurality of through holes therein; and
a plurality of light emitting modules located between the two base plates, each light emitting module comprising a heat sink sandwiched between the two base plates and an LED module embedded in a bottom surface of the heat sink;
wherein the LED modules are respectively in alignment with the through holes of the lower base plate to generate light through corresponding through holes; and
wherein the heat sink of each of the light emitting modules comprises a conductive cylinder and a plurality of fins extending outwardly and radially from a circumference of the conductive cylinder, the LED module embedded in a bottom surface of the conductive cylinder.

2. The LED lamp as claimed in claim 1, wherein each of the light emitting modules comprises a lens engaging with the bottom surface of the conductive cylinder to enclose the LED module therein, and wherein the lens has a lower portion extending downwardly through a corresponding through hole.

3. The LED lamp as claimed in claim 2, wherein the bottom surface of the conductive cylinder of the heat sink is recessed inwardly to define a receiving recess accommodating the LED module therein, and an annular step facing downwardly and below the receiving recess.

4. The LED lamp as claimed in claim 3, wherein the lens of each of the light emitting modules has an engaging flange extending outwardly from an upper end thereof, an annular wall being defined in the conductive cylinder of the heat sink and extending upwardly from an inner edge of the annular step for engaging an outer circumference of the engaging flange of the lens.

5. The LED lamp as claimed in claim 4, wherein each of the light emitting modules comprises a retaining ring which is put on the lower portion of the lens and abutted simultaneously against the annular step and a bottom surface of the engaging flange.

6. The LED lamp as claimed in claim 1, wherein the conductive cylinder of the heat sink has a plurality of conductive plates extending outwardly from a circumference thereof, each conductive plate defining a retaining sleeve in distal end thereof.

7. The LED lamp as claimed in claim 6, wherein a plurality of bolts are received in the retaining sleeves and each have two opposite ends engaging with the two base plates to assemble the two base plates and the light emitting modules together.

8. The LED lamp as claimed in claim 1, wherein the two base plates parallel to each other are triangular, and each have three round corners and three bevel edges curved inwards, the two base plates having flanges extending from edges thereof toward each other.

9. The LED lamp as claimed in claim 1, further comprising a fixing member comprising a fixing part and a plurality of suspending wires connected to the fixing part and the upper base plate.

10. An LED (light emitting diode) lamp, comprising:
an upper base plate;
a lower base plate spaced from the upper base plate and defining a plurality of through holes therein; and
a plurality of light emitting modules located between the two base plates, each of the light emitting modules comprising a heat sink sandwiched between the two base plates, the heat sink of each of the light emitting modules comprising a conductive cylinder and a plurality of fins extending outwardly and radially from a circumference of the conductive cylinder, an LED module embedded in a bottom surface of the conductive cylinder of the heat sink and a lens engaging with the bottom surface of the conductive cylinder to enclose the LED module therein;
wherein a lower portion of each lens extends downwardly through a corresponding through hole.

11. The LED lamp as claimed in claim 10, wherein the bottom surface of the conductive cylinder of the heat sink is recessed inwardly to define a receiving recess accommodating the LED module therein and an annular step facing downwardly and located below the receiving recess.

12. The LED lamp as claimed in claim 11, wherein the lens of each of the light emitting modules has an engaging flange extending outwardly from an upper end thereof, an annular wall being defined in the conductive cylinder and extending upwardly from an inner edge of the annular step and engaging an outer circumference of the engaging flange of the lens.

13. The LED lamp as claimed in claim 12, wherein each of the light emitting modules comprises a retaining ring which is put on a part of the lower portion of the lens immediately below the engaging flange and abuts simultaneously against the annular step and a bottom surface of the engaging flange.

14. The LED lamp as claimed in claim 10, wherein the conductive cylinder of the heat sink has a plurality of conductive plates extending outwardly from a circumference thereof, each conductive plate defining a retaining sleeve in distal end thereof.

15. The LED lamp as claimed in claim 14, wherein a plurality of bolts are received in the retaining sleeves and each have two opposite ends engaging with the two base plates to assemble the two base plates and the light emitting modules together.

16. The LED lamp as claimed in claim 10, wherein the two base plates are triangular in shape, each having three round corners and three bevel edges curved inwards, the two base plates having flanges extending toward each other.

* * * * *